US006967879B2

(12) United States Patent
Mizukoshi

(10) Patent No.: US 6,967,879 B2
(45) Date of Patent: Nov. 22, 2005

(54) MEMORY TROUBLE RELIEF CIRCUIT

(75) Inventor: Noriko Mizukoshi, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

(21) Appl. No.: 10/716,876

(22) Filed: Nov. 20, 2003

(65) Prior Publication Data
US 2004/0151022 A1   Aug. 5, 2004

(30) Foreign Application Priority Data
Nov. 20, 2002  (JP) .................... P.2002-336566
Oct. 31, 2003  (JP) .................... P.2003-372027

(51) Int. Cl.[7] .................. G11C 29/00; G06F 11/00
(52) U.S. Cl. ...................... 365/200; 714/42
(58) Field of Search .................. 365/200, 201, 365/225.7; 714/37, 42

(56) References Cited

U.S. PATENT DOCUMENTS

| 5,862,088 A | * | 1/1999 | Takemoto et al. | ......... 365/201 |
| 5,946,250 A | * | 8/1999 | Suzuki | .............. 365/201 |
| 6,438,044 B2 | * | 8/2002 | Fukuda | ............... 365/200 |
| 6,556,479 B2 | * | 4/2003 | Makuta et al. | ........... 365/200 |
| 6,668,348 B1 | * | 12/2003 | Nakamura | ............. 365/201 |
| 6,711,705 B1 | * | 3/2004 | Yasui | ................ 365/201 |
| 6,762,963 B2 | * | 7/2004 | Inoue et al. | ............. 365/200 |

FOREIGN PATENT DOCUMENTS

JP    11-238393    8/1999

* cited by examiner

Primary Examiner—Trong Phan
(74) Attorney, Agent, or Firm—McDermott Will & Emery LLP

(57) ABSTRACT

When a redundancy circuit is provided to relieve the inferiority of a semiconductor storage device, and then, the semiconductor storage device has no defect, power is inconveniently supplied even to the unused redundancy circuit to generate unnecessary leakage current.

A self-diagnosis circuit for a semiconductor storage device is provided to perform the self-diagnosis of the semiconductor storage device upon turning on a power source. Power (2) is supplied to a redundancy circuit part and power (1) is supplied to a circuit part except the redundancy circuit part. When the semiconductor storage device has no defect as a result of the self-diagnosis, a control for turning off the power (2) of the redundancy circuit part is performed.

6 Claims, 4 Drawing Sheets

MEMORY TROUBLE RELIEF CIRCUIT

BACKGROUND OF THE INVENTION

1. Field of the Invention

The present invention relates to a semiconductor storage device for performing a redundancy relief in the semiconductor storage device.

2. Description of the Related Art

With the progress of miniaturization of a semiconductor, the semiconductor including a semiconductor storage device has usually had a redundancy circuit to relieve the defect of a semiconductor device part. When a defect is detected in the storage device part upon inspection, the storage device part has been replaced by the redundancy circuit part to realize the improvement of a yield of the semiconductor. (JP-A-11-238393 or the like)

However, in the usual semiconductor including the semiconductor storage device, when the defect is not detected in the semiconductor storage device part upon inspection, a redundancy relief circuit is not used, so that leakage current is inconveniently generated even in the unused circuit.

SUMMARY OF THE INVENTION

The present invention is designed to solve the usual problem as described above, and aimed to provide a memory trouble relief circuit which can reduce the leakage current generated by unused redundancy circuit.

A first aspect of the memory trouble relief circuit of the invention is directed to a memory trouble relief circuit for relieving the failure of a memory of a semiconductor integrated circuit having the memory, comprising: a redundancy relief circuit having a redundancy circuit by which the defective part of the memory is replaced based on the diagnosed result of the memory; and a power line of different system from that of a power source for the semiconductor integrated circuit. According to this structure, the power sources of the semiconductor integrated circuit and redundancy relief circuit are provided in separate systems. Thereby, when the memory has no failure upon inspection of the semiconductor integrated circuit, it becomes possible not to supply power to the redundancy relief circuit. Thus, a leakage current generated in an unused redundancy circuit can be reduced.

A second aspect of the memory trouble relief circuit of the invention is directed to a memory trouble relief circuit for relieving the failure of a memory of a semiconductor integrated circuit having the memory, said memory trouble relief circuit comprising: a self-diagnosis circuit for diagnosing the memory and outputting the diagnosed result to an external power control circuit and a redundancy relief circuit having a redundancy circuit by which the defective part of the memory is replaced based on the diagnosed result, wherein the supply of power to the redundancy relief circuit is controlled independently of the supply of power to the semiconductor integrated circuit by the power control circuit operating based on the diagnosed result According to this structure, based on the self-diagnosis result, the supply of power to the redundancy relief circuit is controlled independently of the supply of power to the semiconductor integrated circuit. Therefore, when the memory has no failure upon inspection of the semiconductor integrated circuit, control is exercised so as not to supply power to the redundancy relief circuit. Thereby, the leakage current generated in the unused redundancy circuit can be reduced.

A third aspect of the memory trouble relief circuit of the invention is directed to a memory trouble relief circuit for relieving the failure of a memory of a semiconductor integrated circuit having the memory, comprising: a holding unit for previously holding a diagnosed result of the memory upon inspection of the semiconductor integrated circuit and a redundancy relief circuit having a redundancy circuit by which the defective part of the memory is replaced based on the diagnosed result, wherein the supply of power to the redundancy relief circuit upon actual use of the semiconductor integrated circuit is controlled independently of the supply of power to the semiconductor integrated circuit by the power control circuit operating based on the diagnosed result. According to this structure, upon actual use of the semiconductor integrated circuit, the diagnosed result pre-held upon inspection of the semiconductor integrated circuit is utilized to control the supply of power to the redundancy relief circuit independently of the supply of power to the semiconductor integrated circuit. Therefore, when the memory has no failure upon inspection of the semiconductor integrated circuit, control is exercised so as not to supply power to the redundancy relief circuit. Thereby, the leakage current generated in the unused redundancy circuit can be reduced.

In the second and third aspects of the memory trouble relief circuit of the invention, the power for the redundancy relief circuit is supplied from a different power source from that of the semiconductor integrated circuit. According to this structure, the power source of the redundancy relief circuit is made different from the power source of the semiconductor integrated circuit, thereby reliably controlling the power for the redundancy relief circuit.

Besides, the self-diagnosis circuit outputs, to the power control circuit, the diagnosed result of the memory obtained as the self-diagnosis circuit operates every time power is turned on. According to this structure, the power is controlled based on the diagnosed result only when turned on, and can thereafter be used as usual.

In the invention, the defective part of the memory is replaced by means of fuse control. According to this structure, by utilizing the fuse control, the defective part of the memory can be reliably replaced by the redundancy circuit.

According to the invention, the power source for the redundancy relief circuit is independent of the power source for the semiconductor integrated circuit. Therefore, the supply of power to the redundancy relief circuit can be shut off when the memory has no failure. Thus, the leakage current generated in the unused redundancy circuit can be reduced.

DESCRIPTION OF THE PREFERED EMBODIMENTS (First Embodiment)

Figure 1:
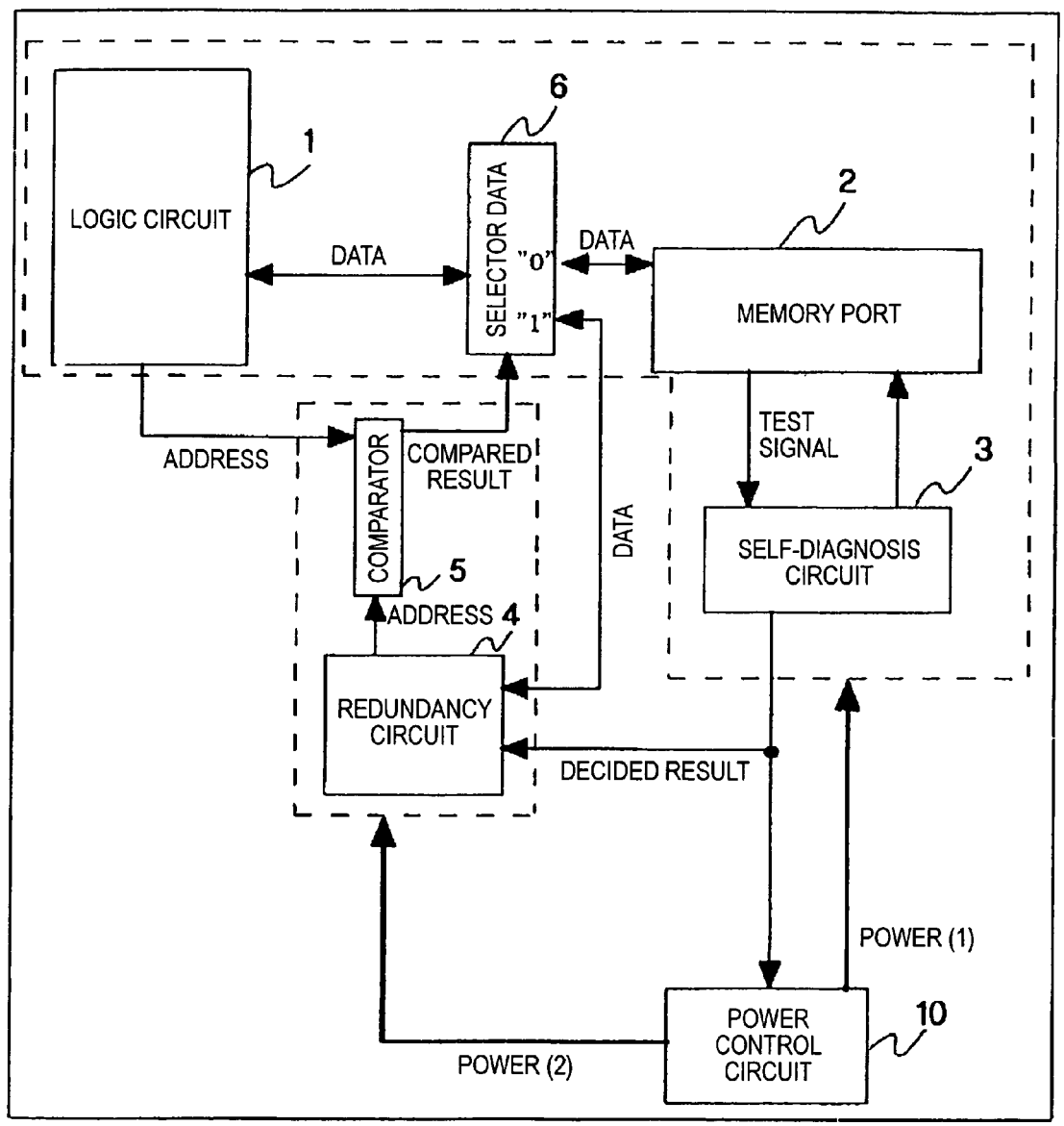
FIG. 1 is a diagram showing the structure of a memory trouble relief circuit according to a first embodiment of the present invention.

FIG. 1 is a diagram showing the structure of a memory trouble relief device according to the first embodiment of the present invention.

The memory trouble relief device comprises a logic circuit 1 for realizing an actual function, a memory part 2 used by the logic circuit 1, a self-diagnosis circuit 3 for recognizing whether or not the failure of the memory part 2 is present, a redundancy circuit 4 for performing a replacement of the defective part of the memory part 2 by control of fuse or the like, on the basis of the decided result of the self-diagnosis circuit 3, a comparator 5 for comparing the address of the memory designated by the logic circuit 1 with determination result (address which indicates the failure part) outputted from the redundancy circuit 3 and a selector 6 for selectively allowing the logic circuit 1 to access the redundancy relief circuit 4 when the memory is failed in accordance with the result of the comparator 5.

Power (1) is supplied to the logic circuit 1, the memory part 2, the self-diagnosis circuit 3 and the selector and power (2) is supplied to the redundancy circuit 4 and the comparator 5. A power control circuit 10 controls a supply of the power (1) and the power (2) based on the result of the self-diagnosis circuit 3. The power control circuit is provided outside or inside a semiconductor chip.

Figure 2:
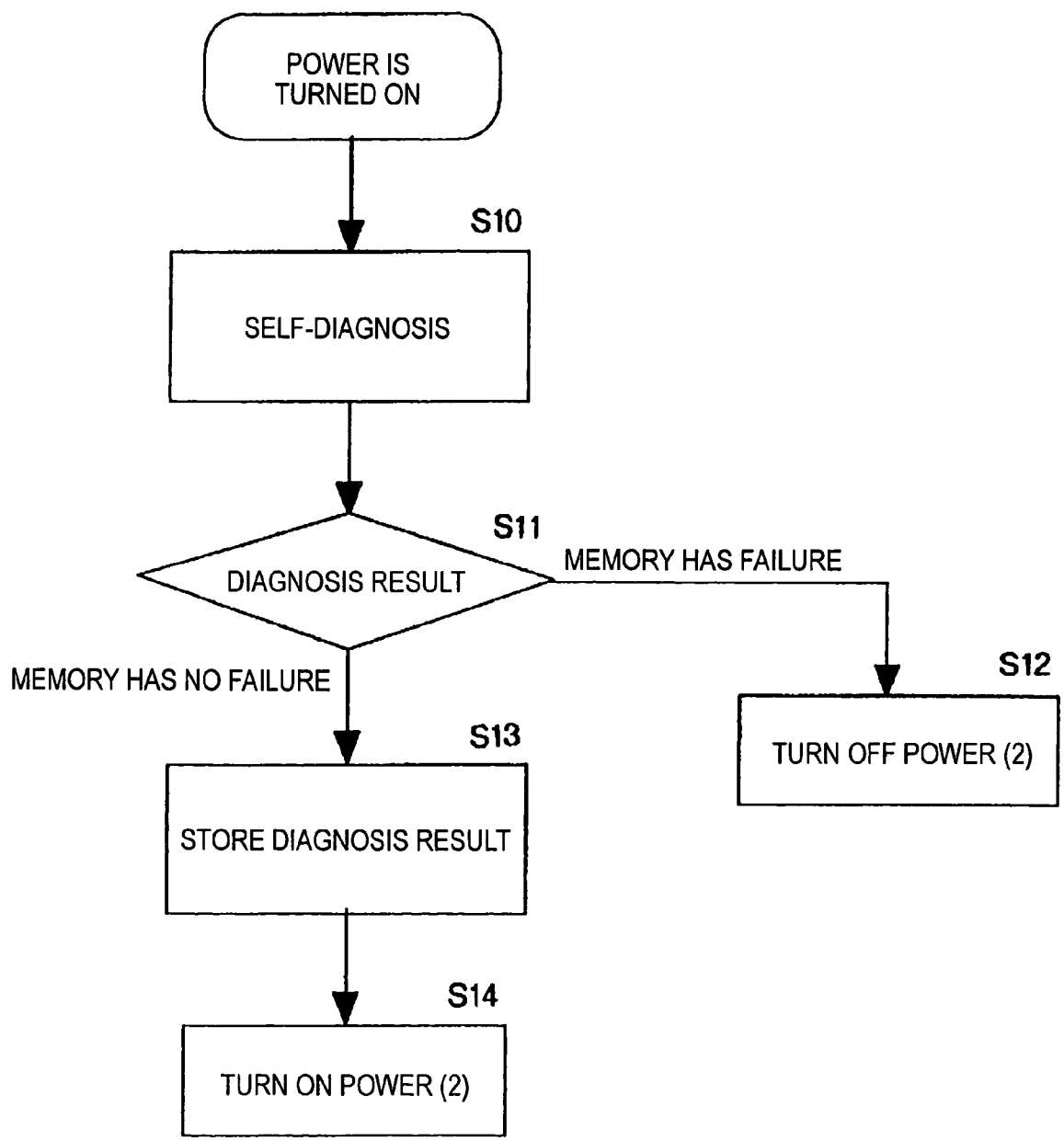
FIG. 2 is a diagram showing an operation flow of a memory trouble relief circuit according to a second embodiment of the present invention.

FIG. 2 is a diagram showing the operation flow of a memory trouble relief device according to a second embodiment of the present invention. In the operation flow of the memory trouble relief device, when a power is turned on, the self-diagnosis circuit 3 operates to perform the self-diagnosis of the memory (S10), and determines the result of the self-diagnosis (S11). When the result that the memory has no failure is outputted, the power control circuit 10 controls the power source of the power (2) to be turned OFF (S12). When the result that the memory has the failure is outputted, the result of the self-diagnosis is stored in the redundancy circuit 4 (S13), and next the power control circuit 10 controls the power source of the power (2) to be turned ON (S14). Since the result of the self-diagnosis is held while the power is turned on, if the self-diagnosis circuit 3 is operated once upon turning on the power, the power (2) will not be controlled after that.

According to the first embodiment, the power sources of the semiconductor integrated circuit and redundancy relief circuit are provided in separate systems. Thereby, when the memory has no failure upon inspection of the semiconductor integrated circuit, it becomes possible not to supply power to the redundancy relief circuit. Thus, a leakage current generated in an unused redundancy circuit can be reduced.

(Second Embodiment)

Figure 3:
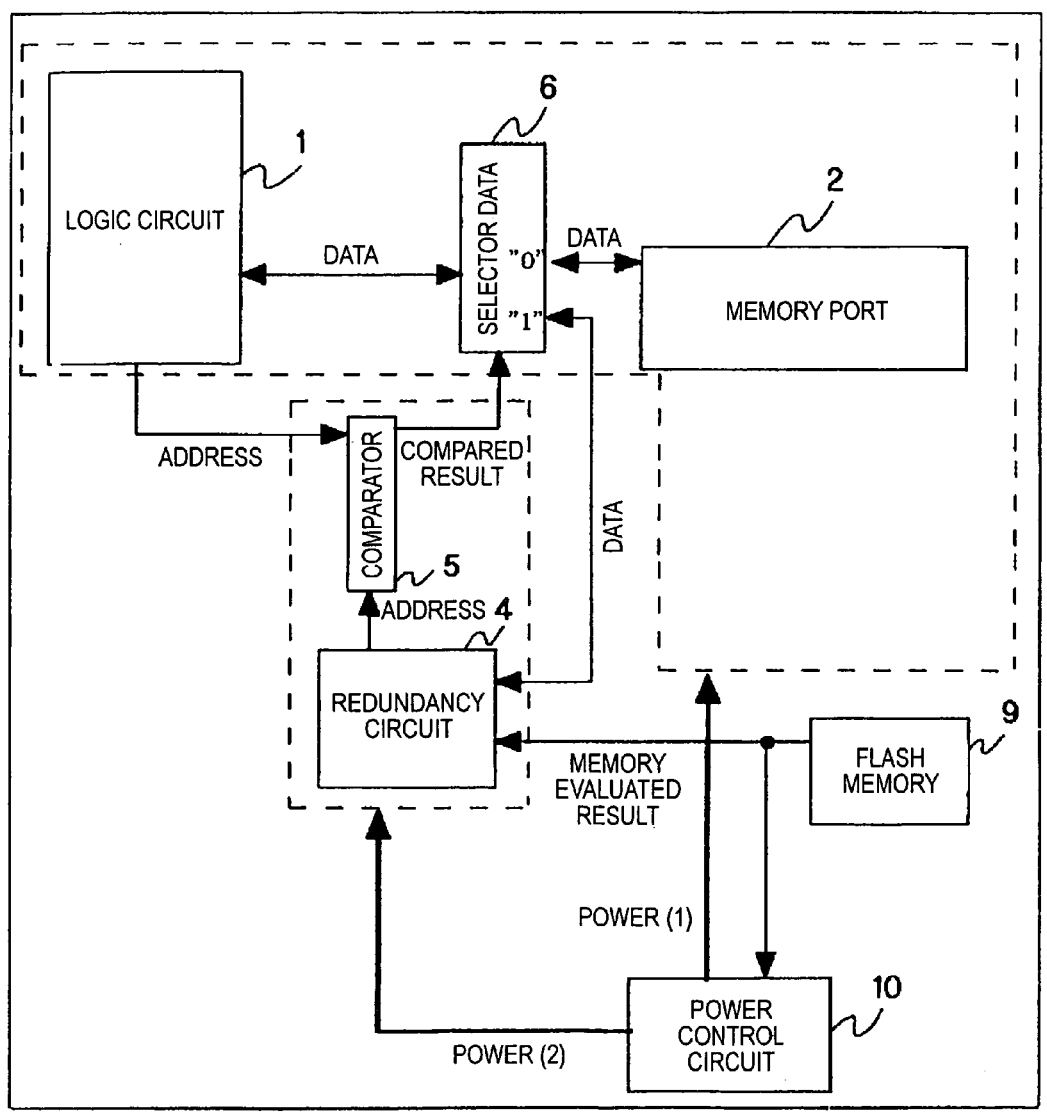
FIG. 3 is a diagram showing the structure of a memory trouble relief circuit according to a third embodiment of the present invention.

FIG. 3 is a block diagram showing the structure of a memory trouble relief circuit according to the second embodiment of the invention. The description will be made with like reference numerals given to the same parts as in FIG. 1. In FIG. 3, the memory trouble relief circuit comprises a logic circuit 1, a memory part 2, a redundancy circuit 4, a Flash memory 9 for holding the inspected result of a semiconductor integrated circuit, a comparator 5 for comparing an address designated by the logic circuit 1 with a decided result stored in the Flash memory 9, a selector 6 for enabling the logic circuit 1 to access the redundancy circuit 4 when the compared result of the comparator 5 indicates that the memory part 2 has a defective memory cell.

Power (1) is supplied to the semiconductor integrated circuit having the logic circuit 1, memory part 2 and selector 6. Power (2) is supplied to a redundancy relief circuit having the redundancy circuit 4 and comparator 5. A power control circuit 10 controls the supply of the powers (1) and (2) based on the result of evaluating the memory, held by the Flash memory 9.

Figure 4:
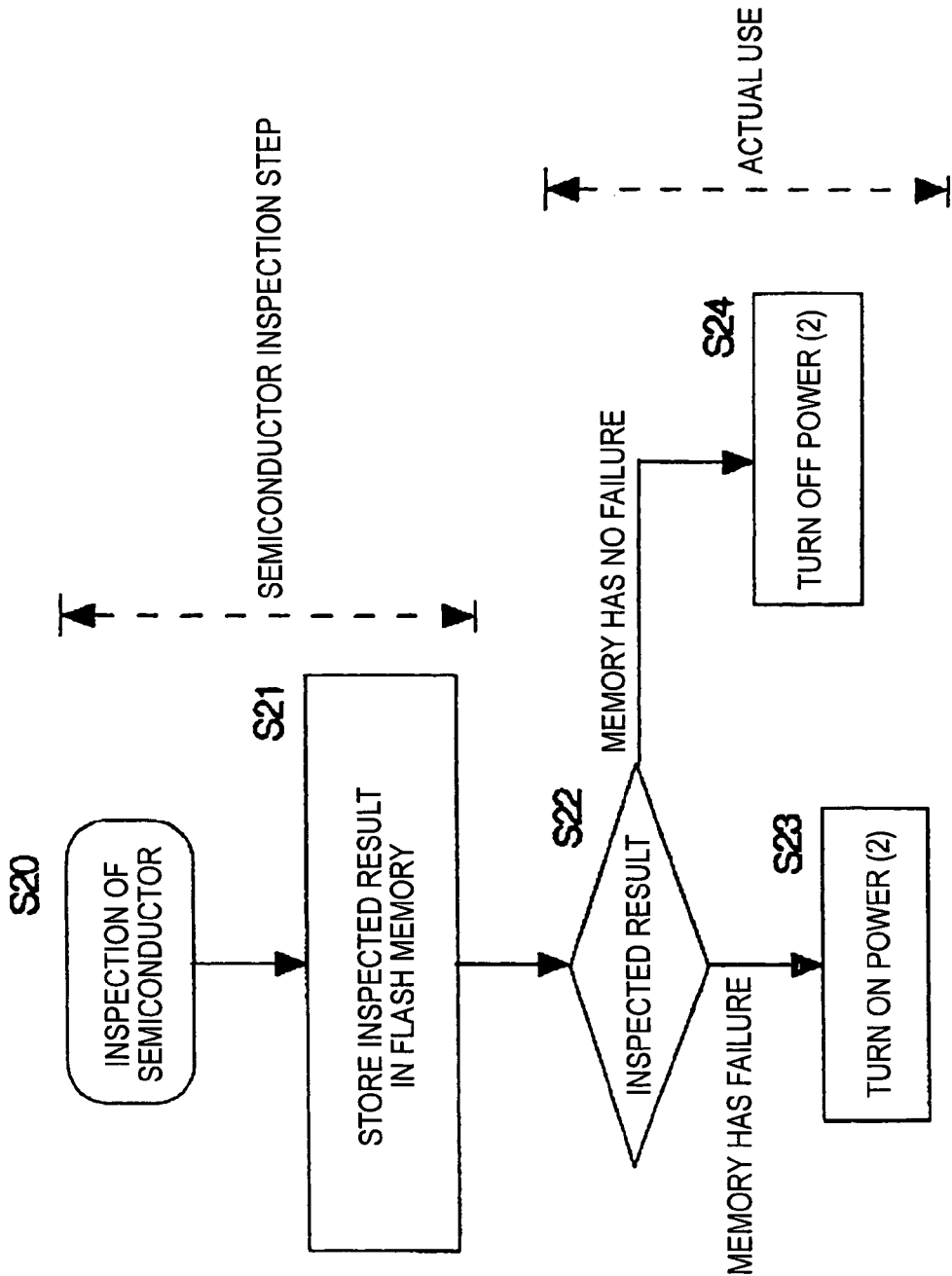
FIG. 4 is a diagram showing an operation flow of a memory trouble relief circuit according to a fourth embodiment.

FIG. 4 is a diagram showing the operation flow of a memory trouble relief device according to a fourth embodiment of the present invention.

The operation flow of the memory trouble relief device may be roughly divided into a semiconductor inspection step and an actual use In the inspection step of the semiconductor, the test of the memory part 2 is performed (S20) and the inspected results about the presence or absence of the defect or failure of the memory and the defective part of the memory are stored in a Flash memory 9 in the semiconductor (S21) Upon actual use, the inspected result is determined by using the presence or absence of the defect or failure of the memory stored in the Flash memory 9 (S22). When the defect or failure of the memory exists, the power control circuit 10 performs a control for turning the power (2) ON (S23). When the defect or failure of the memory does not exist, the power control circuit 10 performs a control for turning the power (3) OFF (S24).

According to the second embodiment, the power sources of the semiconductor integrated circuit and redundancy relief circuit are provided in separate systems. The presence or absence of the defect or failure of the memory part, which is the result obtained upon inspection, is stored in the Flash memory. Thus, upon actual use, control is exercised so as not to supply power to the redundancy circuit depending on the presence or absence of the defect or failure of the memory part. Thereby, an unused redundancy circuit can be prevented from generating a leakage current.

The first and second embodiments have described the case in which the supply of power to the redundancy relief circuit is controlled such that the power (2) is turned on if the memory has a failure and the power (2) is turned off if the memory has no failure. However, the structure may be made as follows. If the memory has no failure, a power source line for supplying the power (2) is cut by trimming, so as not to supply the power to the redundancy relief circuit.

The memory trouble relief circuit of a semiconductor integrated circuit according to the present invention can control the power depending on the presence or the absence of the failure of the memory. When the failure of the memory does not exist, unnecessary leakage current can be reduced in an unused redundancy relief circuit part and consumed current can be effectively reduced in the semiconductor integrated circuit on which the memory is mounted. Especially, the memory trouble relief circuit is useful for portable terminal equipment requested for low consumed current.

What is claimed is:

1. A memory trouble relief circuit for relieving a failure of a memory of a semiconductor integrated circuit having the memory, the memory trouble relief circuit comprising:

a self-diagnosis circuit, which diagnoses the memory and outputs a diagnosed result to an external power control circuit; and a redundancy relief circuit, which have a redundancy circuit by which a defective part of the memory is replaced based on the diagnosed result, wherein a supply of power to the redundancy relief circuit is controlled independently of a supply of power to the semiconductor integrated circuit by the external power control circuit operating based on the diagnosed result.

2. A memory trouble relief circuit according to claim 1, wherein the supply of power to the redundancy relief circuit is supplied from a power source different from that of the semiconductor integrated circuit.

3. A memory trouble relief circuit according to claim 1, wherein the self-diagnosis circuit outputs the diagnosed result of the memory obtained every time a power is turned on to the power control circuit.

4. A memory trouble relief circuit according to claim 1, wherein the power control circuit is provided outside the semiconductor integrated circuit.

5. A power control method for a memory trouble relief circuit according to claim 1, wherein power is supplied to the redundancy relief circuit only when the defective part of the memory is replaced by the redundancy circuit based on the diagnosed result of the memory.

6. A power wiring method for a memory trouble relief circuit according to claim 1, wherein a power supply line for the redundancy relief circuit is cut by trimming when the defective part of the memory is not replaced by the redundancy circuit based on the diagnosed result of the memory.

* * * * *